United States Patent [19]

Bellanger et al.

[11] 4,320,362

[45] Mar. 16, 1982

[54] FILTER FOR ANALOG SIGNALS

[75] Inventors: Maurice G. Bellanger, Paris; Jean Gaillard, Verrieres-le-buisson, both of France

[73] Assignee: Telecommunications Radioelectriques et Telephoniques T.R.T., Paris, France

[21] Appl. No.: 58,578

[22] Filed: Jul. 18, 1979

[30] Foreign Application Priority Data

Jul. 27, 1978 [FR] France ............................... 78 22248

[51] Int. Cl.³ .................... H03H 15/02; H03H 19/00; G11C 27/00
[52] U.S. Cl. .................................. 333/165; 333/166; 333/173
[58] Field of Search ............. 333/166, 173, 165, 28 R; 328/167, 165, 150–151; 307/221 D

[56] References Cited

U.S. PATENT DOCUMENTS

| | | | |
|---|---|---|---|
| 3,375,451 | 3/1968 | Borelli et al. | 328/165 X |
| 3,852,619 | 12/1974 | Carbrey | 333/28 R X |
| 4,031,490 | 6/1977 | Copeland | 333/165 |

*Primary Examiner*—Marvin L. Nussbaum
*Attorney, Agent, or Firm*—Thomas A. Briody; William J. Streeter; Laurence A. Wright

[57] ABSTRACT

In a filter in which, in order to obtain the desired filter characteristic, a weighted sum of different signals is formed, it is proposed in accordance with the invention that for the formation of said sum means are employed which are constituted by capacitor circuits, which during a first time interval are each charged by said signals, and by a connection circuit for the formation, during a second time interval, of the equivalent of a single capacitor across whose plates the weighted-sum signal appears.

The invention is used for the filtration of sampled analog signals.

9 Claims, 12 Drawing Figures

FILTER FOR ANALOG SIGNALS

The invention relates to a filter for analog signals, comprising means formed with the aid of capacitors for the formation of a weighted sum of the various signals available in said filter.

BACKGROUND OF THE INVENTION

French Pat. No. 2,339,287 describes a filter for analog signals in which the means for forming the weighted sum are constituted by capacitive dividers whose dividing ratios are determined by the numerical value of the weighting coefficient.

Also known are charge-transfer filters in which the weighting is obtained by means of capacitors with divided plates or with split electrodes.

All these filters are of the transversal type, which in order to obtain satisfactory frequency-selectivity characteristics, require the formation of a sum which comprises many terms.

In these known filters the weighting coefficients can only be positive and smaller than unity.

It is the object of the present invention to provide a filter of the type mentioned in the preamble, which may take the form of any digital-filter configuration (recursive or non-recursive filters).

SUMMARY OF THE INVENTION

To this end a filter for analog signals is characterized in that the means for the formation of a weighted sum are constituted by capacitor circuits, which are each charged in a first time interval by the said available signals and by a connection circuit for the formation, in a second time interval, of the equivalent of a single capacitor on whose plates the weighted-sum signal appears.

An important characteristic feature of the invention in accordance with which at least one of the capacitor circuits is formed by a capacitor to which a switching circuit of the first type is connected for inverting in the second time interval, the voltage across its plates relative to the charging voltage in the first time interval, makes it possible to obtain negative weighting coefficients with an absolute value smaller than unity.

Another important characteristic feature of the invention, in accordance with which at least one of the capacitor circuits is formed by at least two capacitors to which a switching circuit of a second type is connected for connecting said capacitors in parallel during the first time interval and for connecting said capacitors in series during the second time interval, makes it possible to obtain weighting coefficients greater than unity.

A further important characteristic feature of the invention, in accordance with which at least one of the capacitor circuits is formed by means of at least two capacitors to which a switching circuit of a third type is connected for connecting said capacitors in parallel during the first time interval and for connecting said capacitors in series during the second time interval with a polarity which is inverted relative to that during the first time interval, makes it possible to obtain negative weighting coefficients with absolute values greater than unity.

For obtaining coefficients with absolute values greater than unity the invention, in accordance with a further characteristic feature, proposes that for at least one of the capacitor circuits there is provided an amplifying circuit with a gain higher than unity for amplifying the signals available during the first time interval.

Thus, the capacitance values of the capacitors in the capacitor circuits in combination with the gain of the amplifying circuit, enables any desired value to be obtained for the weighting coefficients.

If such a filter is to be realized as an integrated circuit and in MOS technology, the problem may arise of realizing amplifying circuits with an accurately defined gain. It is known that by means of this technology only amplifiers with unity gain can be realized with great accuracy. In accordance with a further major characteristic feature of the invention the amplifying circuit with a gain higher than unity is formed by a first amplifier with unity gain and by a switching circuit of a fourth type for ensuring that a plurality of capacitors are charged by the output voltage of the first amplifier during one of said time intervals and for connecting said plurality of capacitors in series with the input of a second unity-gain amplifier during the other of said time intervals.

In this way such an amplifying circuit can be realized by amplifiers with unity gain, enabling a filter in accordance with the invention which comprises at least one such circuit to be integrated readily in MOS technology.

BRIEF DESCRIPTION OF THE DRAWINGS

The following description with reference to the accompanying drawings, given by way of example, will illustrate how the invention may be realized wherein.

DESCRIPTION OF THE PREFERRED EMBODIMENTS

Figure 1:
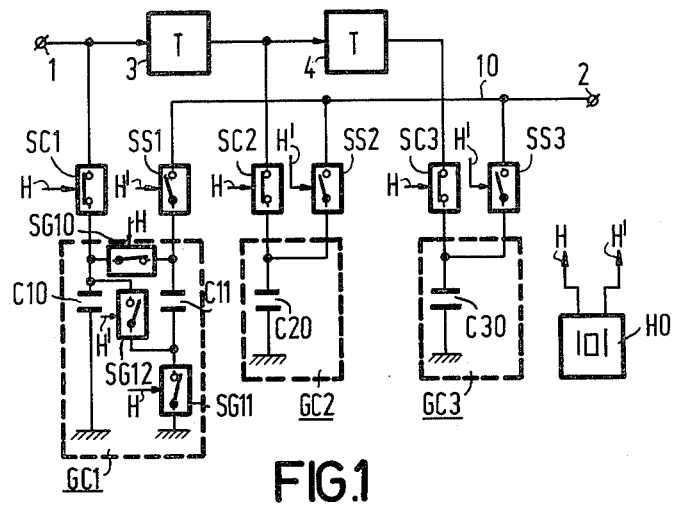
FIG. 1 represents a transversal filter in accordance with the invention.

The filter shown in FIG. 1 is of the transversal type. The signal to be filtered is applied to its input terminal 1; the filtered signal appears on the output terminal 2. This filter comprises two delay elements 3 and 4 each producing a delay equal to T. If the input signal is represented by x(t), where "t" is the variable representing time, and the output signal is represented by y(t), a transversal filter comprising two delay means establishes a relationship between the input signal and the output signal, which may be written as:

$$y(t) = a_0 \cdot x(t) + a_1 x(t-T) + a_2 \cdot x(t-2T) \quad (1)$$

where $a_0$, $a_1$, $a_2$ are weighting coefficients which depend on the filtration to be obtained. In this case the output signal is the weighted sum of the signals $x(t)$, $x(t-T)$, $x(t-2T)$ which are respectively available on the terminal 1, on the output on the delay element 3, and on the output of the element 4.

In accordance with the invention, for determining $y(t)$, the means for forming a weighted sum are constituted by capacitor circuits GC1, GC2, GC3, which are each charged, during a first time interval via switching means SC1, SC2, SC3 by the voltages representing the signals $x(t)$, $x(t-T)$ and $x(t-2T)$ and by a connection circuit comprising a line 10 and different switching means SS1, SS2 and SS3 for the formation, in the second time interval, of the equivalent of a single capacitor across whose plates the signal $y(t)$ appears. In this example the signal $y(t)$ appears between the terminal 2 and earth.

Figure 2:
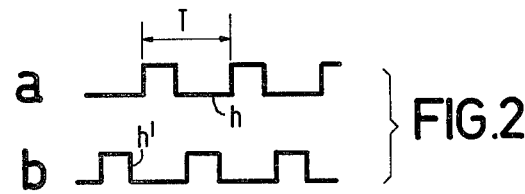
FIG. 2 represents the variation of the signal defining the first and the second time interval.

The first and the second time interval are defined by a clock generator HO which on the lines H and H' supplies signals "h" and "h'", whose variation is represented on the lines "a" and "b" in FIG. 2. Said signals have a period T and are never active at the same time. These signals are said to be active when they are in the high state. The switching means SC1, SC2, SC3 are each provided with an actuator which is connected to the line H; similarly, the means $SS_1$, $SS_2$, $SS_3$ are provided with an actuator connected to the line H'. Said means are set to the closed position when the signal applied to their actuators is active.

The capacitor circuit GC1 comprises two capacitors C10 and C11. A first plate of the capacitor C10 is connected to the input terminal 1 via the means SC1, the second plate of thus capacitor C10 being connected to earth. A first plate of the capacitor C11 is connected both to the line 10 via the switching means SS1 and to the first plate of the capacitor C10 via a switching means SG10.

The second plate of the capacitor C11 is connected both to earth via a switching means SG11 and to the first plate of the capacitor C10 via a switching means SG12. The actuators of the means SG10 and SG11 are connected to the line H and those of the means SG12 to the line H'. The circuit GC2 comprises a single capacitor C20 whose plate is connected to earth and whose other plate is connected both to the output of the delay element 3 via the switching means SC2 and to the line 10 via the switching means SS2. The circuit GC3 also comprises a single capacitor C30 of which one plate is connected to earth and of which the other plate is connected both to the output of the element 4 via the means SC3 and to the line 10 via the means SS3.

Such a filter operates as follows:

When the signal "h" is active, the capacitors C10 and C11 of the circuit GC1 are charged by the voltage $x(t)$, the capacitor C20 of the circuit GC2 b the voltage $x(t-T)$, and the capacitor C30 of the circuit GC3 by the foltage $x(t-2T)$.

When the signal "h'" becomes active, the two capacitors C10 and C11, which were connected in parallel, are connected in series in such a way that the charge Q1 stored by the combination GC1 is:

$$Q = 2 \cdot \frac{c10 \cdot c11}{c10 + c11} x(t)$$

where c10 and c11 are the capacitances of the capacitors C10 and C11.

The charges Q2 and Q3 of the combinations GC2 and GC3 are:
$Q2 = c20 \cdot x(t-T)$
$Q3 = c30 \cdot x(t-2T)$ Thus, depending on the time in which "h'" is active, the equivalent of a single capacitor is obtained between the terminal 2 and earth, whose capacitance $c_T$ is:

$$c_T = \frac{c10 \cdot c11}{c10 + c11} + c20 + c30$$

The voltage $y(t)$ is thus written as:

$$y(t) = (Q1 + Q2 + Q3)/c_T$$

so that:

$$y(t) = 2 \cdot \frac{c10 \cdot c11}{(c10 + c11)c_T} \cdot x(t) + \frac{c20}{c_T} \cdot x(t-T) + \frac{c30}{c_T} \cdot x(t-2t)$$

By a suitable choice of the value of the various capacitances, it is possible to obtain all the values $a_0$, $a_1$ and $a_2$ of formula (1), except for a proportionality factor.

Since the circuit GC1 comprises two capacitors, a high coefficient $a_0$ can be obtained.

Figure 3:
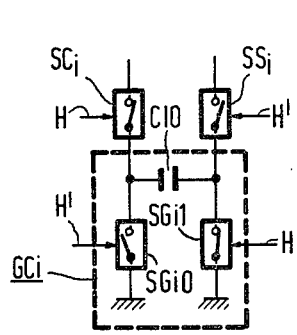
FIG. 3 represents a capacitor circuit by means of which negative weighting coefficients with absolute values smaller than unity can be obtained.

In order to obtain a negative weighting coefficient, the capacitor circuit GCi shown in FIG. 3 may be used. It comprises a capacitor CiO, of which a first plate is connected both to the switching means SCi and via the switching means SGiO to earth, and of which the second plate is connected both to the switching means SSi and via the means SGi1 to earth The actuators of said means SGi0 and SGi1 are respectively connected to the lines H' and H. In this arrangement the capacitor has plates which are interchanged between the interval in which H is active and the interval in which H' is active.

Figure 4:
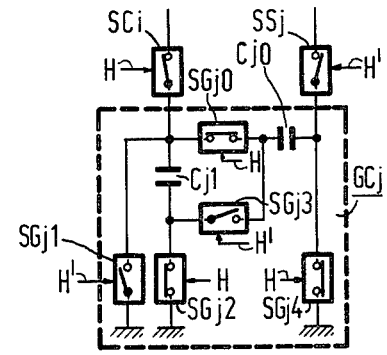
FIG. 4 represents a capacitor circuit which enables negative weighting coefficients with absolute values greater than unity to be obtained.

In order to obtain a higher negative weighting coefficient, the circuit GCj of FIG. 4 may be used. It comprises a first capacitor Cj0, of which a first plate is connected to the means SCi via a switching means SGj0. This armature is also connected, always via the means SGj0, both to earth via a switching means SGj1 and to the first plate of a capacitor Gj1. The second plate of this capacitor Cj1 is connected both to earth via a switching means SGj2 and to the first plate of the capacitor Cj0 via a switching means SGj3. The second plate of the capacitor Cj0 is connected both to the means SSj and via a switching means SGj4 to earth. The actuators of the means SGj0, SGj2 and SGj4 are connected to the line H and the actuators of the means SGj1, SGj3 to the line H'.

Figure 5:
FIG. 5 shows how an amplifying circuit may be arranged in order to obtain weighting coefficients greater than unity.

When the signal "h" is active the capacitors Cj0 and Cj1 are connected in parallel and are charged, when the signal "h'" is active the capacitors Cj0 and Cj1 are connected in series and their polarity is inverted, i.e. the voltage at the means SSj is of a sign opposed to that of the charging voltage at the means SCi. In order to obtain large weighting coefficients the voltages with a large coefficient (see FIG. 5) may be amplified by means of an amplifier Ak before they are transferred to a capacitor circuit GCk (not shown) via the switching means SCk.

The concept of the invention may be utilized for other filter arrangements.

Figure 6:
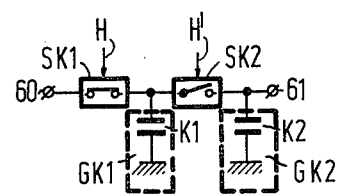
FIG. 6 shows a first-order recursive filter in accordance with the invention.

In FIG. 6 the filter comprises two capacitor circuits GK1 and GK2 which respectively comprises a single capacitor K1 and K2, of which each time one of the plates is connected to earth. The other plate of the capacitor K1 is connected both to the input terminal 60 via a switching means SK1 and to the output terminal 61 via a switching means SK2. The other plate of the capacitor K2 is connected to the terminal 61. The actuators of the means SK1 and SK2 are respectively connected to the lines H and H' so as to receive the same signals as shown in FIG. 2.

When the switching means SK2 is in the open position, the capacitor K1 is charged by the voltage x(t) applied to the input, while the capacitor K2 is charged by the voltage y(t). When the means SK2 is closed, the voltage $v_s(t)$ on the terminal 61 assumes the value:

$$v_s(t) = \frac{k2}{k1 + k2} y(t) + \frac{k1}{k1 + k2} x(t)$$

where k1 and k2 respectively represent the capacitance value of the capacitors K1 and K2.

Subsequently, at the instant (t+T), the voltage x(t+T) is stored in the capacitor K1 and the voltage $v_s(t)$ is available on terminal 61; said voltage $v_s(t)$ thus corresponds to the voltage y(t+T), so that the input quantity x(t) is related to the output quantity y(t) as follows:

$$y(t) = \frac{k2}{k1 + k2} y(t - T) + \frac{k1}{k1 + k2} x(t)$$

if $r = k1/(k1+k2)$ the transfer function of such a filter in z: $H_1(z)$ may be written as:

$$H_1(z) = \frac{rz^{-1}}{1 - (1 - z)z^{-1}}$$

so that a first-order recursive filter is obtained. This is a first-order network in the most general form except for a scale factor.

Figure 7:
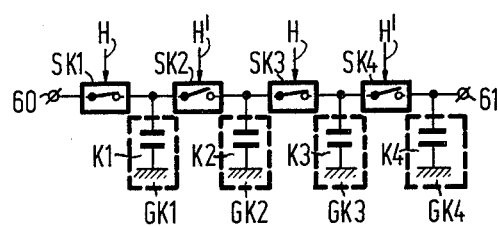
FIG. 7 shows a second-order recursive filter in accordance with the invention.

Networks of a higher order can be obtained by connecting a plurality of first-order networks of this type in cascade. FIG. 7 shows such a recursive network of the second order, formed by cascading two networks of the type shown in FIG. 6.

To the filter shown in FIG. 6 two other capacitor circuits are added, each formed by a single capacitor K3 and K4 with a capacitance k3 and k4 respectively. One plate of the capacitors k3 and k4 is connected to earth; the other plate of the capacitor K4 is connected both to the output terminal 61 and to the other plate of the capacitor K3 via a switching means SK4, whose actuator is connected to the line H'. The other plate of the capacitor K3 is connected to the non-earthed plate of the capacitor K2 via a switching means SK3, whose actuator is connected to the line H. It can be demonstrated that the transfer function of a filter $H_2z$ may be written as:

$$H_2(z) = \frac{(r1 \cdot r2 \cdot r3)z^{-2}}{1 - (1 + r2 - r1 \cdot r2 - r2 \cdot r3)z^{-1} + r2(1 - r1 - r3 + r1 \cdot r3)z^{-2}}$$

where
$r1 = k1/(k1 + k2)$
$r2 = k2/(k2 + k3)$
$r3 = k3/(k3 + k4)$

It is evident that the capacitor circuits may be realised in the same way as the circuit GC1 shown in FIG. 1 or as the circuits shown in FIGS. 3 and 4. It is also possible to employ the arrangement of FIG. 7. However, it is to be noted that the main advantage of the filter shown in FIG. 7 resides in the simplicity of its arrangement.

In accordance with the invention second-order filters may be realized whose transfer function in "z" may have a denominator and a numerator. An embodiment of a filter is proposed having the following transfer function:

$$H(z) = ek \frac{(1 + 0.3516z^{-1} + z^{-2}) \cdot z^{-1}}{1 - 1.5982z^{-1} + 0.6753z^{-2}}$$

where ek is a constant which will be determined hereinafter.

Figure 8:
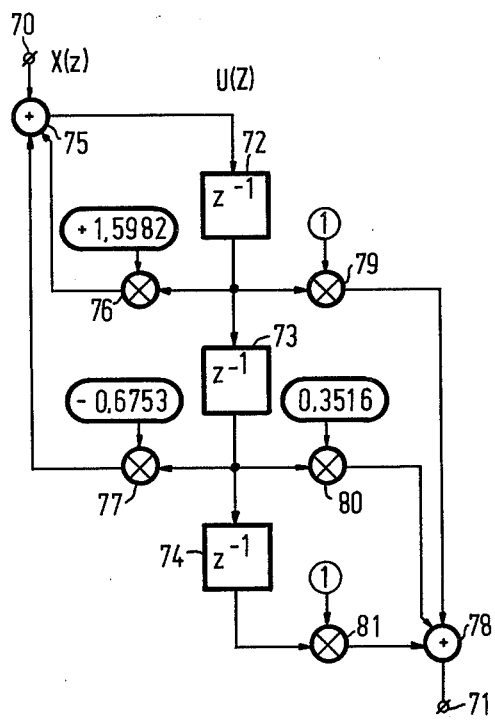
FIG. 8 shows a conventional filter, which realised in accordance with the invention as shown in FIG. 9.

This filter corresponds to the conventional form shown in FIG. 8; the transformed signal in z,X(z), is applied to the terminal 70 and the output signal Y(z) appears on the output terminal 71; this filter comprises three delay elements 72, 73 and 74, which are connected in cascade. The signal X(z) is applied to the input of the element 72 via an adder 75. The output of the element 72 is connected to an input of said adder via a multiplying means 76, which multiplies the signal available on the output of the element 72 by +1.5982. The output of the element 73 is connected to another input of the adder 75 via a multiplying means 77, which multiplies the signal available on the output of the element 73 by −0.6753. The signal which appears on the output 71 is the result supplied by an adder 78, which provides the sum of the signals supplied by the multiplying means 79, 80 and 81. The means 79 multiplies the output signal of the element 72 by 1, the means 80 amplifies the output signal of the element 73 by +0.3516 and the means 81 multiplies the output signal of the element 74 by 1.

Figure 9:
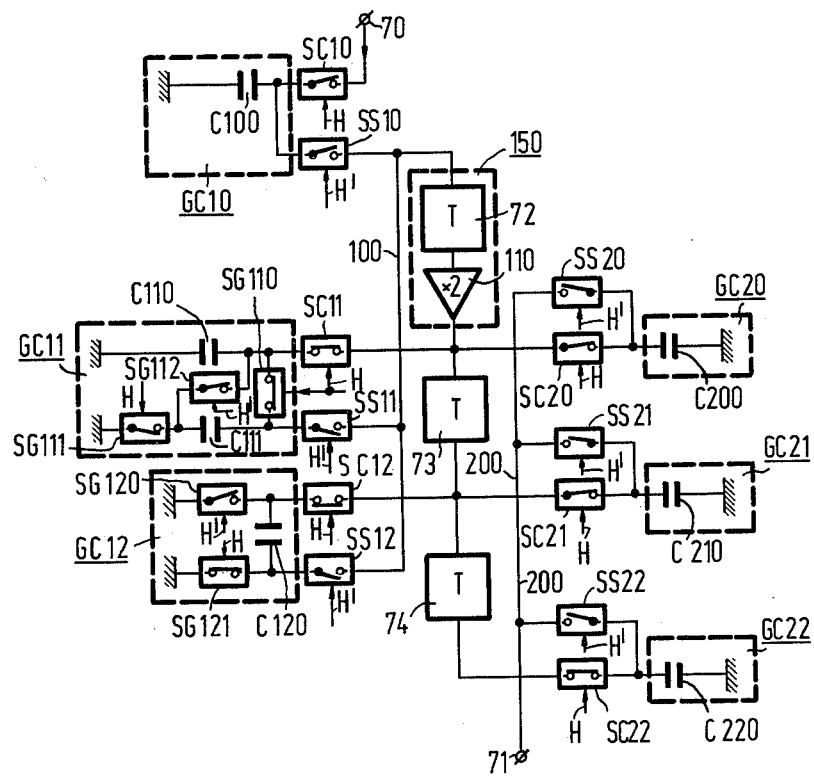

FIG. 9 shows how said filter is realized in accordance with the invention. The elements corresponding to those in FIG. 8 bear the same reference numerals.

In order to obtain the weighted sum represented in the denominator of the transfer function H(z), the filter shown in FIG. 9 comprises the capacitor circuits GC10, GC11 and GC12. The circuit GC10 is connected to the terminal 70 via a switching means SC10, whose actuator is connected to the line H and to a line 100 via a switching means SS10, whose actuator is connected to the line H'; said line 100 is connected to the input of the element 72. In the filter of FIG. 9 an amplifier 110 having a gain factor 2 is included between the delay elements 72 and 73. The element 72 and the amplifier 110 constitute an assembly 150. The circuit GC11 is connected both to the output of the assembly 150 via a switching means SC11 and to the line 100 via a switching means SS11. The circuit GC12 is connected both to the output of the means 73 via the means SC12 and to the line 110 via the means SS12. The actuators of the means SC11 and SC12 are connected to the line H and those of the means SS11 and SS22 are connected to the line H'.

The capacitor circuit GC10 has the same structure as the circuits GC2 or GC3 shown in FIG. 1; it comprises a single capacitor C100. The circuit GC11 has the same structure as the circuit GC1 shown in FIG. 1, thus comprising two capacitors C110 and C111 and switching means SG110, SG111 and SG112. The circuit GC12 has the same structure as the circuit shown in FIG. 3 and thus comprises a capacitor C120 and two switching means SG120 and SG121.

For realising the weighted sum represented by the numerator of the transfer function H(z), the filter of FIG. 9 comprises the capacitor circuits GC20, GC21, GC22, of which the first one is connected both to the output of the assembly 150 via a switching means SC20 and to a line 200 via a switching means SS20, of which the second one is connected both to the output of the element 73 via a switching means SC21 and to the line 200 via a switching means SS21, and of which the third one is connected both to the output of the element 74 via a means SC22 and to the line 200 via a means SS22. The actuators of the means SC20, SC21, SC22 are connected to the line H, those of the means SS20, SS21, SS22 to the line H'. The terminal 71 is connected to the line 200. The circuits GC20, GC21, GC22 each comprises a single capacitor with the respective references C200, C210, C220.

Figure 10:
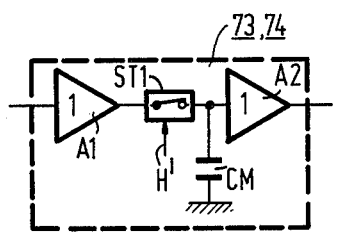
FIG. 10 in detail shows a delay element forming part of the filter shown in FIG. 9.

FIG. 10 shows how the delay elements 73 and 74 are realized. They comprise a capacitor CM of which one plate is connected to earth and of which the other plate is connected both to the output of an amplififer A1 with unity gain via a switching means ST1 and to the input of a second amplifier A2 having unity gain. The actuator of the means ST1 is connected to the line H'.

Figure 11:
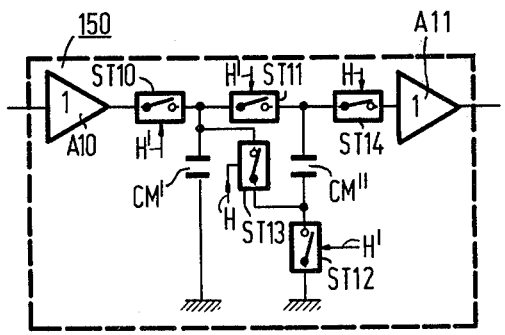
FIG. 11 in detail shows an arrangement comprising the cascade of a delay element and an amplifying circuit.

FIG. 11 shows an example of the assembly 150. It comprises a first capacitor CM', of which one plate is connected to earth and of which the other plate is connected both to the output of a unity-gain amplifier A10 via a switching means ST10 and to the first plate of a second capacitor CM" via a switching means ST11; the second plate is connected both to earth via a switching means ST12 and to the non-earthed plate of the capacitor CM' via a switching means ST13. The first plate of the capacitor CM" is also connected to the input of a unity-gain amplifier A11 via a switching means ST14. The actuators of the switching means ST10, 11, 12 are connected to the line H' and those of the means ST13, 14 to the line H. Such an assembly operates as follows: When the signal "h'" is active, the two parallel-connected capacitors of equal capacitance are charged by the output voltage of the amplifier A10, when "h" is active the two capacitors CM' and CM" are connected in series, so that twice the output voltage of the amplifier A10 is applied to the input of the amplifier A11. Thus, the gain of the two is obtained.

In the following it is explained how the capacitances c100, c110, c111, c120, c200, c210, c220 of the capacitors C100, C110, C111, C120, C200, C210, C220 of FIG. 9 are determined.

First of all the values of the capacitances c100, c110, c111 and c120 will be determined. This is done by means of a single u(t) which appears on the line 100.

$$u(t) = e1 \cdot x(t) + 1.5982 u(t-T) - 0.6753 u(t-2T) \quad (2)$$

where x(t) is the time variable of which X(z) is the transform in z and e1 is a proportionality factor. Said signal is supplied when C100 is connected in parallel with both the series connection of the capacitance C110 and C111 and with the capacitor C120, whose plates have been interchanged after it has been charged. The charge Q1 on this capacitor C100 may be written as:

$$Q1 = c100 \cdot x(t)$$

The charge Q2 of the two series-connected capacitors C110 and C111 may be written as:

$$Q2 = 4u(t-T) \cdot \frac{c110 \cdot c111}{c110 + c111}$$

As the capacitors C110 and C111 have the same capacitance c110, the charge Q2 may ultimately be written as:

$$Q2 = 2 \cdot u(t-T) \cdot c110$$

The charge Q3 in the circuit GC12 may be written as:

$$Q3 = 2 \cdot u(t-2T) \cdot c120.$$

The voltage u(t) on the line 100, taking into account the reversal of the plates of the capacitor C120, may be written as:

$$u(t) = \frac{Q1 + Q2 - Q3}{c100 + (0,5 \cdot c110) + c120} \quad (3)$$
$$u(t) = \frac{c100 \cdot x(t) + 2 \cdot c110 \cdot u(t-T) - 2 \cdot c120 \cdot u(t-2T)}{c100 + (0,5 \cdot c110) + c120}$$

When it is assumed that this equation is identical to the equation (2), this yields $$c120/c100 = 0.6753/1.5982 = 0.422$$

since $$2 \cdot c110 / (c100 + (0.5 \cdot c110) + c120) = 1.5982$$

and when the capacitance c100 is taken as the unit, this ultimately yields:
c100 = 1
c110 = 3.03
c120 = 1.28
The value e1 becomes:
e1 = 0.263.
Now the values of the capacitances c200, c210 and c220 will be determined. Then the following is written:

$$y(t) = 2 \frac{c200 \cdot u(t-T)}{c200 + c210 + c220} + 2 \frac{c210 \cdot u(t-2T)}{c200 + c210 + c220} + 2 \frac{c220 \cdot u(t-3T)}{c200 + c210 + c200}$$

It is assumed a priori:
c200 = c220 = 1
so that:
c210 = 0.3516.
y(t) is writtin as:

$$y(t) = e2 \ 1 \cdot u(t-T) + 0.3516 u(t-2T) + 1 \cdot u(t-2T)$$

where e2 = 2/(1 + 0.3516 + 1) = 0.850 the value ek is such that
ek = e1·e2 = 0.223.
Thus, the desired transfer function is obtained in a satisfactory manner.

Figure 12:
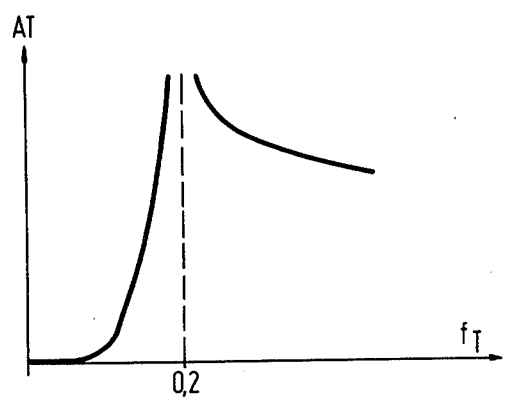
FIG. 12 shows the response curve of the filter shown in FIG. 9.

FIG. 12 shows the response curve of the filter shown in FIG. 9 and corresponding to the diagram of FIG. 8.

The capacitance values are determined in such a way that the charging time constant of the capacitors is small with respect to the sampling period.

It is to be noted that a filter as shown in FIG. 9 may readily be integrated in MOS technology. The various switching means may be realised by field-effect transistors in accordance with known techniques. The use of unity-gain amplifiers is of special advantage in this technology, because only such amplifiers can be realised by means of this technology if the presence of resistors whose value is difficult to adjust is to be avoided.

It is evident that in accordance with the invention any higher-order filter may be realised by combining first-order and the second-order networks of the type described.

What is claimed is:

1. An analog signal processor comprising a plurality of charge storage circuits, each comprising an input, an output, a common terminal, a first capacitor and first switching means for connecting a first electrode of the first capacitor to said input, said analog signal processor being capable of deriving a weighted sum of various signals to be applied to the inputs of said charge storage circuits, at least one of the charge storage circuits and a second switching means of said analog signal processor is connected between the second electrode of the capacitor and the output of said one of the charge storage circuits, and said one of the charge storage circuits further comprises third and fourth switching means for connecting selectively the second or the first electrode of the first capacitor of said one of the charge circuits to its common terminal.

2. An analog signal processor as claimed in claim 1, wherein the first and third switching means are driven simultaneously by first clock pulses and the second and fourth switching means are driven simultaneously by second clock pulses, which do not overlap the first clock pulses.

3. An analog signal processor as claimed in claim 1 comprising a plurality of delay line elements and means for deriving a weighted sum from output signals of said delay line elements.

4. An analog signal processor comprising a plurality of charge storage circuits, each comprising an input, an output, a common terminal, a first capacitor and first switching means for connecting a first electrode of the first capacitor to said input, said analog signal processor being capable of deriving a weighted sum of various signals, to be applied to the inputs of said charge storage circuits, at least one of the charge storage circuits of said analog signal processor further comprises a second capacitor, second switching means, for connecting a first electrode of said second capacitor to the output of said one of the charge storage circuits, and third, fourth, and fifth switching means for selectively connecting the first and second capacitor in series or in parallel.

5. An analog signal processor as claimed in claim 4, wherein the second electrode of the first capacitor of said one of the charge storage circuits is connected to the common terminal, the third switching means is connected between the first electrode of the first capacitor and the first electrode of the second capacitor, the fourth switching means is connected between the first electrode of the first capacitor and the second electrode of the second capacitor, the fifth switching means being connected between the second electrode of the second capacitor and the common electrode of said one of the charge storage circuits.

6. An analog signal processor as claimed in claim 5, wherein the first, third and fifth switching means are driven simultaneously by first clock pulses and wherein the second and fourth switching means are driven simultaneously by second clock pulses, which do not overlap the first clock pulses.

7. An analog signal processor as claimed in claim 4, wherein said one of said charge storage circuits further comprises sixth and seventh switching means, the third switching means being connected between the first electrode of the first capacitor and the second electrode of the second capacitor, the fourth switching means being connected between the second electrode of the first capacitor and the second electrode of the second capacitor, the fifth switching means being connected between the first electrode of the second capacitor and the common terminal of said one of the charge storage circuits, the sixth switching means being connected between the first electrode of the first capacitor and the common terminal of said one of the charge circuits, and the seventh switching means being connected between the second electrode of the first capacitor and the common electrode of said one of the charge storage circuits.

8. An analog processor as claimed in claim 7, wherein the first, third, fifth and seventh switching means are driven by first clock pulses and the second, fourth and sixth switching means are driven by second clock pulses, which do not overlap the first clock pulses.

9. An analog signal processor as claimed in claim 8 comprising a plurality of delay line elements and means for deriving a weighted sum from output signals of said delay line elements.

* * * * *